(12) United States Patent
Tamada

(10) Patent No.: US 7,965,548 B2
(45) Date of Patent: *Jun. 21, 2011

(54) SYSTEMS AND DEVICES INCLUDING MEMORY RESISTANT TO PROGRAM DISTURB AND METHODS OF USING, MAKING, AND OPERATING THE SAME

(75) Inventor: Satoru Tamada, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/705,917

(22) Filed: Feb. 15, 2010

(65) Prior Publication Data

US 2010/0149866 A1 Jun. 17, 2010

Related U.S. Application Data

(63) Continuation of application No. 12/014,658, filed on Jan. 15, 2008, now Pat. No. 7,755,939.

(51) Int. Cl.
*G11C 16/04* (2006.01)

(52) U.S. Cl. ......... 365/185.02; 365/185.17; 365/185.23; 365/185.24; 365/185.25

(58) Field of Classification Search ............. 365/185.02, 365/185.17, 185.23, 185.24, 185.25
See application file for complete search history.

(56) References Cited

U.S. PATENT DOCUMENTS

| | | | |
|---|---|---|---|
| 5,160,860 A | 11/1992 | Runaldue | |
| 5,812,457 A | 9/1998 | Arase | |
| 5,969,990 A * | 10/1999 | Arase | 365/185.25 |
| 5,991,202 A * | 11/1999 | Derhacobian et al. | 365/185.19 |
| 6,049,494 A | 4/2000 | Sakui et al. | |
| 6,072,721 A | 6/2000 | Arase | |
| 6,091,666 A | 7/2000 | Arase et al. | |
| 6,191,975 B1 | 2/2001 | Shimizu et al. | |
| 6,353,553 B1 | 3/2002 | Tamada et al. | |
| 6,380,636 B1 | 4/2002 | Tatsukawa et al. | |
| 6,385,084 B1 | 5/2002 | Tamada et al. | |
| 6,396,738 B1 | 5/2002 | Tamada et al. | |
| 6,519,186 B2 | 2/2003 | Tamada et al. | |
| 6,580,639 B1 | 6/2003 | He et al. | |
| 6,744,670 B2 | 6/2004 | Tamada et al. | |
| 6,771,536 B2 | 8/2004 | Li et al. | |
| 6,804,150 B2 * | 10/2004 | Park et al. | 365/185.18 |
| 6,859,395 B2 | 2/2005 | Matsunaga et al. | |
| 6,859,397 B2 | 2/2005 | Lutze et al. | |
| 7,177,173 B2 | 2/2007 | Futatsuyama | |
| 7,471,565 B2 | 12/2008 | Aritome | |
| 7,492,641 B2 | 2/2009 | Hosono et al. | |
| 7,525,841 B2 | 4/2009 | Aritome | |
| 7,561,469 B2 * | 7/2009 | Aritome | 365/185.18 |
| 7,660,157 B2 * | 2/2010 | Maejima et al. | 365/185.17 |

(Continued)

OTHER PUBLICATIONS

Neal Mielke, "*Reliability of Floating-Gate Flash Memories*"; Intel Corporation; Presented by Hanmant Belgal.
Takeuchi K et al. "*A Source-Line Programming Scheme for Low Voltage Operation NAND Flash Memories*" Symp. IEEE Journal of Solid-State Circuits; May 2000; Issue 5, pp. 672-681 http://ieeexplore.ieee.org/xpl/freeabs_all.jsp?tp=&arnumber=841463&isnumber=18193.

(Continued)

*Primary Examiner* — Connie C Yoha
(74) *Attorney, Agent, or Firm* — Fletcher Yoder

(57) ABSTRACT

Disclosed are methods, systems and devices, one such device being a memory device configured to concurrently assert a first pulse pattern through a plurality of conductors disposed on both a source side and a drain side of a floating-gate transistor, wherein a source side of the first pulse pattern has a different median voltage than a drain side of the first pulse pattern.

21 Claims, 6 Drawing Sheets

U.S. PATENT DOCUMENTS

| | | |
|---|---|---|
| 2002/0024850 A1 | 2/2002 | Tamada et al. |
| 2002/0036921 A1 | 3/2002 | Tamada et al. |
| 2003/0151950 A1 | 8/2003 | Tamada et al. |
| 2006/0158932 A1 | 7/2006 | Tamada et al. |
| 2009/0015979 A1 | 1/2009 | Fukano et al. |

OTHER PUBLICATIONS

R. Jacob Baker, "*CMOS Circuit Design Layout and Simulation*"; 2005; pp. 466-476; Wiley-Interscience, A John Wiley & Sons, Inc., Publication, Hoboken, New Jersey.

* cited by examiner

|  | INHIBIT - PULSE PATTERN | PROGRAM - PULSE PATTERN |
|---|---|---|
| sgs | 0 | 0 |
| wl0 | 4 | 6 |
| wl1 | 4 | 8 |
| wl2 | 4 | 8 |
| wl3 | 4 | 8 |
| ⋮ | ⋮ | ⋮ |
| wls-4 | 4 | 8 |
| wls-3 | 4 | 0 |
| wls-2 | 4 | 4 |
| wls-1 | 4 | 10 |
| wls | 4 | 24 |
| wls+1 | 4 | 10 |
| wls+2 | 2 | 10 |
| wls+3 | 2 | 10 |
| ⋮ | ⋮ | ⋮ |
| wln-3 | 2 | 10 |
| wln-2 | 2 | 10 |
| wln-1 | 2 | 10 |
| wln | 2 | 10 |
| sgd | 4 | 2 |
| SELECTED dl | 0 | 0 |
| UNSELECTED dl | 2 | 2 |

FIG. 7

SYSTEMS AND DEVICES INCLUDING MEMORY RESISTANT TO PROGRAM DISTURB AND METHODS OF USING, MAKING, AND OPERATING THE SAME

CROSS-REFERENCE TO RELATED APPLICATIONS

This application is a continuation of and claims priority to U.S. patent application Ser. No. 12/014,658, filed on Jan. 15, 2008.

BACKGROUND

1. Field of Invention

Embodiments of the present invention relate generally to electronic devices and, more specifically, in certain embodiments, to memory devices.

2. Description of Related Art

Generally, memory devices include an arrangement of addressable memory cells. For example, some devices include a number of floating-gate transistors positioned according to a grid of conductors. One set of conductors, referred to as "data lines," connects to the floating-gate transistors via their sources or drains, and another set of conductors, referred to as "control lines," connects to control gates of the floating-gate transistors. The control lines and the data lines are often generally perpendicular to each other, and typically, a floating-gate transistor lies near each intersection of a data line and a control line. As a result, each floating-gate transistor may be accessed, e.g., read, erased, or programmed, through a unique control-line, data-line pair.

In some systems, accessing a memory cell can corrupt data stored by other memory cells. Typically, each data line and each control line connect to a plurality of memory cells, so a stimulus (e.g., voltage or current) asserted through a selected data line or a selected control line could affect memory cells other than the one being accessed. For example, certain floating-gate transistors are programmed by asserting a program voltage through a selected control line. The voltage programs the memory cell being accessed, but it could also affect the data stored by other memory cells connected to the same control line. This effect is referred to as "program disturb."

Program disturb is mitigated, in part, by certain conventional techniques, such as asserting a pattern of pass voltages on unselected control lines while floating the unselected data lines. During programming, the unselected control lines capacitively couple to the unselected data lines, and this capacitive coupling counteracts the effect of the program voltage on the unselected memory cells connected to the selected controlline. Electric fields from the pass voltages drive charges toward the memory cells that are at highest risk of program disturb, i.e., the memory cells that are on the selected control line and the unselected data lines. These charges counteract the effect of the program voltage on unselected memory cells by elevating the voltage under the unselected memory cells and lowering the voltage drop across the unselected memory cells. The selected memory cell is not as affected by the pass voltage because the selected data line is not isolated. This technique is referred to as "self-boosting."

Some conventional self-boosting techniques introduce other problems. The pass-voltage patterns often include different voltages asserted on adjacent control lines or other conductors, and the differences in voltage can establish relatively large electric fields between the adjacent structures. These fields are believed to inject stray charges, such as hot electrons or hot holes, into some memory cells, thereby corrupting stored data.

BRIEF DESCRIPTION OF DRAWINGS

FIG. 7 illustrates a programming pattern that embodies an aspect of the present technique.

DETAILED DESCRIPTION

Some of the above-mentioned problems with conventional memory devices may be mitigated by some of the subsequently described embodiments. One embodiment, described below, executes a programming process that is believed to reduce data corruption during programming. In accordance with one embodiment, the process includes asserting a sequence of two pulse patterns on control lines: an inhibit-pulse pattern and a program-pulse pattern. These pulse patterns, in some embodiments, include asserting different voltages on control lines on either side of a selected control line. For instance, during the inhibit pulse, the process may assert lower voltages on the drain-side control lines than on source-side control lines, and during the program pulse, the process may assert lower voltages on the source-side control lines than on the drain-side control lines. The differences in voltage during each of the pulses are believed to reduce the likelihood of the programming process corrupting data. A possible mechanism for the expected reduction is explained below, after describing examples of systems that execute the programming process.

Figure 1:
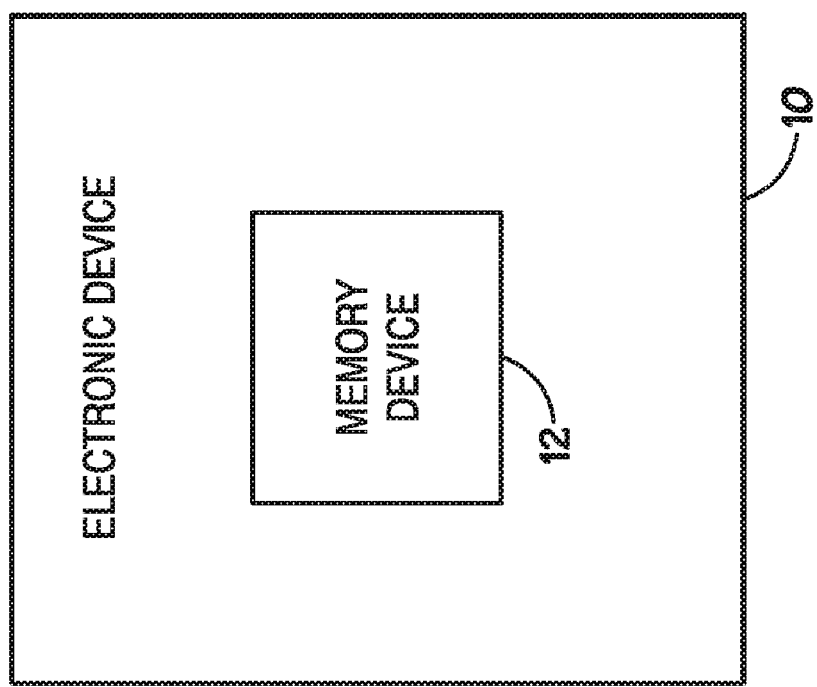
FIG. 1 illustrates an electronic device that embodies an aspect of the present technique.

FIG. 1 depicts an electronic device 10. The illustrated electronic device 10 includes a memory device 12 that, as explained below, may execute the programming process in accordance with embodiments of the present invention. Myriad types of electronic devices 10 may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
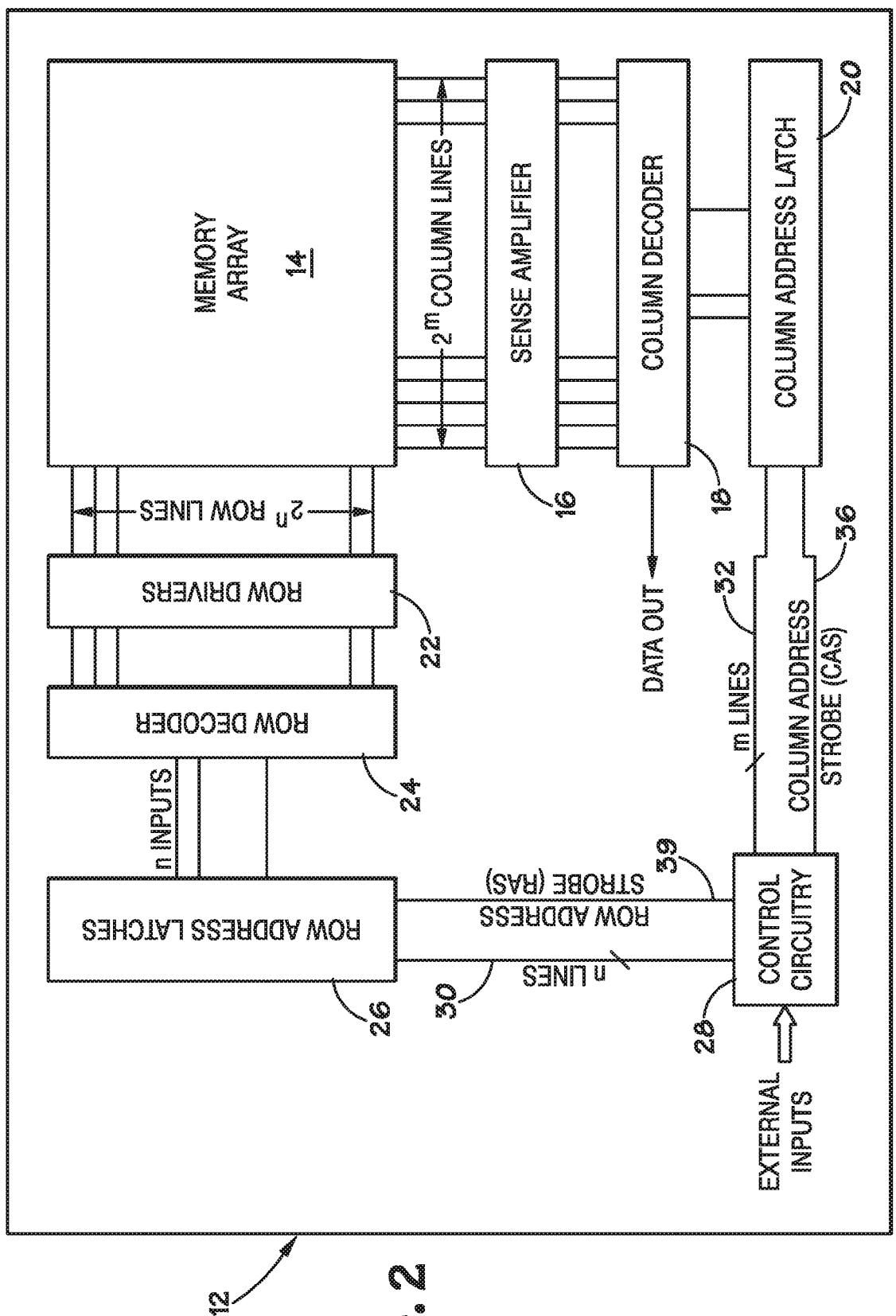
FIG. 2 illustrates a memory device that embodies an aspect of the present technique.

FIG. 2 depicts a block diagram of an embodiment of the memory device 12. The illustrated memory device 12 may include a memory array 14, a sense amplifier 16, a column decoder 18, column-address latches 20, row drivers 22, a row decoder 24, row-address latches 26, and control circuitry 28. Further, as described below with reference to FIG. 5, the memory array 14 may include a matrix of memory cells arranged along control lines and data lines, which may correspond to rows and columns or vice versa.

When operating the memory cells, the control circuitry may receive a command to access, i.e., read, erase, or program, a selected memory cell. The control circuitry 28 may then convert an address of the selected memory cell into a row address and a column address. In the illustrated embodiment, the row address bus 30 transmits the row address to the row address latches 26, and a column address bus 32 transmits column address to the column address latches 20. After an appropriate settling time, a row address strobe (RAS) signal 34 (or other controlling clock signal) may be asserted by the control circuitry 28, and the row address latches 26 may latch (e.g., sense and store) the transmitted row address. Similarly, the control circuitry 28 may assert a column address strobe 36, and the column address latches 20 may latch the transmitted column address.

Once the row and column addresses are latched, the row decoder 24 may determine which row of the memory array 14 corresponds to the latched row address, and the row drivers 22 may assert a signal on the selected row. In some embodiments described below, the rows may correspond to control lines, and the row drivers 22 may assert a program voltage on a selected control line and pass voltages on unselected control lines during certain operations, such as a program operation described below with reference to FIGS. 6 and 7. Similarly, the column decoder 18 may determine which column of the memory array 14 corresponds to the latched column address. In some embodiments, the columns may correspond to data lines. Embodiments, however, are not limited to particular orientations of rows and columns (e.g., perpendicular or up and down) or particular geometries of the data lines and control lines (e.g., straight, level, or undulating).

Figure 3:
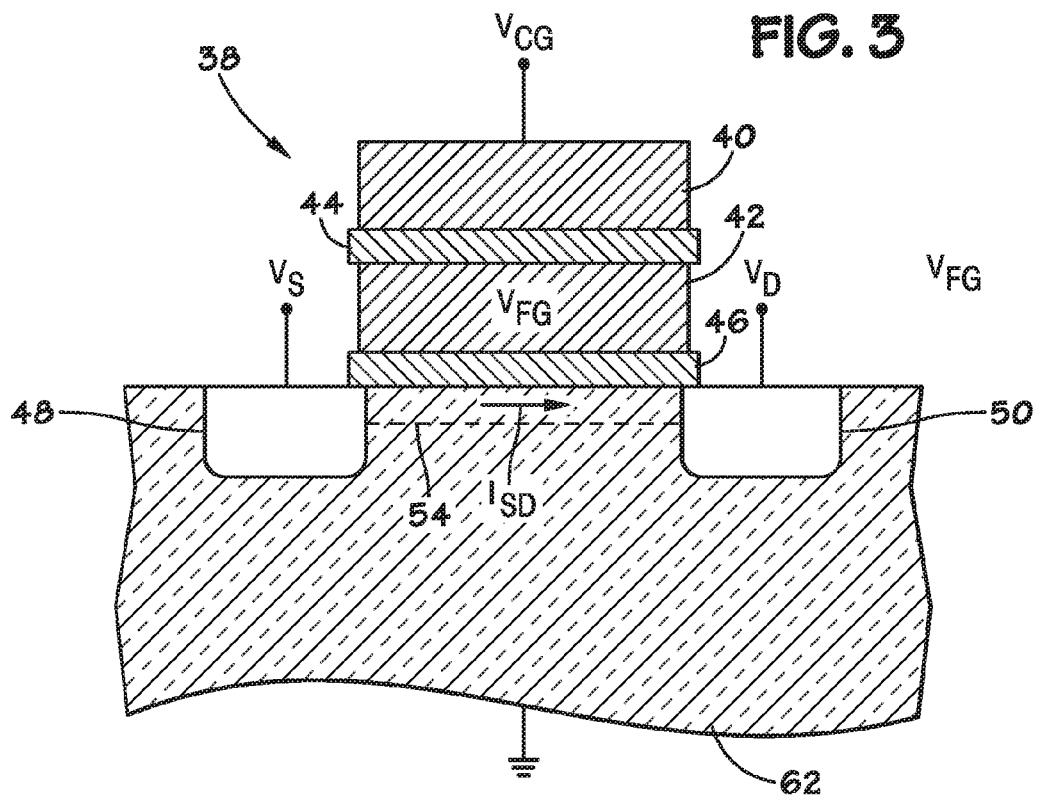
FIG. 3 illustrates a memory cell that embodies an aspect of the present technique.

FIG. 3 illustrates an example of a floating-gate transistor 38. In this embodiment, the floating-gate transistor 38 includes a control gate 40, a floating gate 42, gate-dielectric layers 44 and 46, a source 48, and a drain 50. The source 48 and the drain 50 may be made from doped regions of a semiconductor substrate 52, e.g., the source 48 and the drain 50 may be n+ doped regions in a p− doped, single-crystal-silicon substrate that is undiced; diced; diced and packaged; or diced, packaged, and mounted on a circuit board. The control gate 40 and the floating gate 42 may be made of (e.g., include or consist essentially of) a conductive material, such as metal or doped polysilicon, and the gate-dielectric layers 44 and 46 may be made of a generally nonconductive material, such as silicon dioxide or a hafnium-based, high-k dielectric.

In operation, the floating-gate transistor 38 may store data by modulating a charge of the floating gate 42. To accumulate a charge on the floating gate 42, the voltage of the control gate 40 ($V_{CG}$) may be raised (or lowered, depending on the embodiment) to a programming voltage, such as approximately plus-or-minus 24 volts, and a resulting electric field from the control gate 40 may drive electrons or holes onto, or off of, the floating gate 42. The charge may cross the gate-dielectric layer 46 via a variety of mechanisms, such as hot-electron injection, hot-hole injection, or Fowler-Nordheim tunneling. Thus, asserting the programming voltage on the control gate 40 may move charge between the floating gate 42 and the substrate 52, either elevating or lowering the voltage of the floating gate 42 ($V_{FG}$) in the process. Because the floating gate 42 is generally isolated from other conductors by the gate-dielectric layers 44 and 46, the charges on the floating gate 42 may remain there, even when external power is removed from the floating-gate transistor 38, and the quantity of charge may store data, as explained below with reference to FIG. 4.

Other embodiments may include other types of floating-gate transistors, such as minor-bit floating-gate transistors and various types of fin-FET or multi-gate floating-gate transistors. Some embodiments may include other types of memory, such as phase change memory or semiconductor-oxide-nitride-oxide-semiconductor (SONOS) memory.

The floating-gate transistor 38 may also be erased by changing the charge on the floating gate 42. In some embodiments, the floating-gate transistor 38 is erased by applying an erase voltage to the control gate 40 and, in some embodiments, biasing the substrate 52 or a channel in the substrate 52. A voltage difference between the control gate 40 and the substrate 52 (or channel therein) establishes an electric field across the floating gate 42, and this field reverses the effect of programming, either moving charges onto, or off of, the floating gate 42. In other embodiments, the floating-gate transistor 42 may be erased by exposing it to electromagnetic radiation, such as ultra-violet light.

The data stored by the floating-gate transistor 38 may be read by sensing VFG (or a proxy) and categorizing the sensed quantity as being within some range, e.g., greater than a value, less than a value, or greater than a first value but less than a second value. In this embodiment, VFG is not directly sensed; rather, it is sensed by sensing a property of the floating-gate transistor 38 affected by VFG that is referred to as the threshold voltage (VT). VT may be characterized as the voltage difference between the control gate 40 and the source 48 (VCG-S) that, for a given difference in voltage between the source 48 and the drain 50 (VS-D), results in a given threshold current (IT). In other words, the VT is the value of VCG-S at which the floating-gate transistor 38 turns on, subject to an appropriate definition of "on" for a given application.

Figure 4:
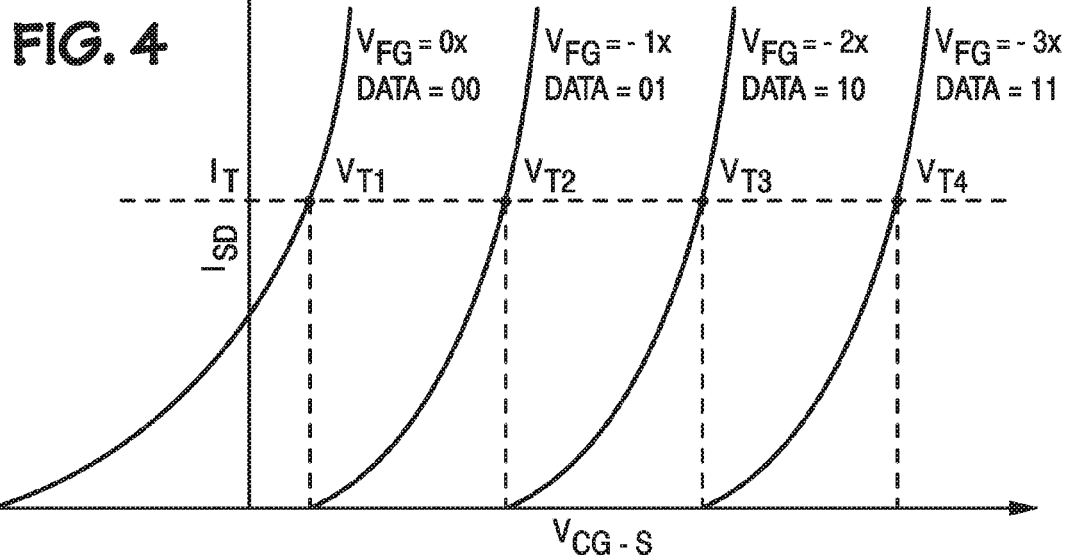
FIG. 4 illustrates I-V traces of memory cells storing different values in accordance with an embodiment.

An example of the relationship between VT and VFG is illustrated by FIG. 4. As VFG increases, VT increases. (Here, the variable "x" indicates an arbitrarily-selected scaling constant. It should be noted, though, that in other embodiments, the increment between each data value may not be uniform.) The electric field from the charge stored on the floating gate 42 (FIG. 3) counteracts—or supplements, depending on their signs—the electric field from the control gate 40, so VFG affects the VCG-S sufficient to establish a channel 54 adequate to carry IT. Thus, VFG and the data stored by this property can be read by sensing and categorizing VT.

The illustrated embodiment categorizes VT into one of four-different ranges, corresponding to four-different data values, or two bits: 00, 01, 10, and 11. Other embodiments may categorize VT into more or fewer ranges corresponding to more or fewer bits, e.g., one, three, four, or five bits.

Figure 5:
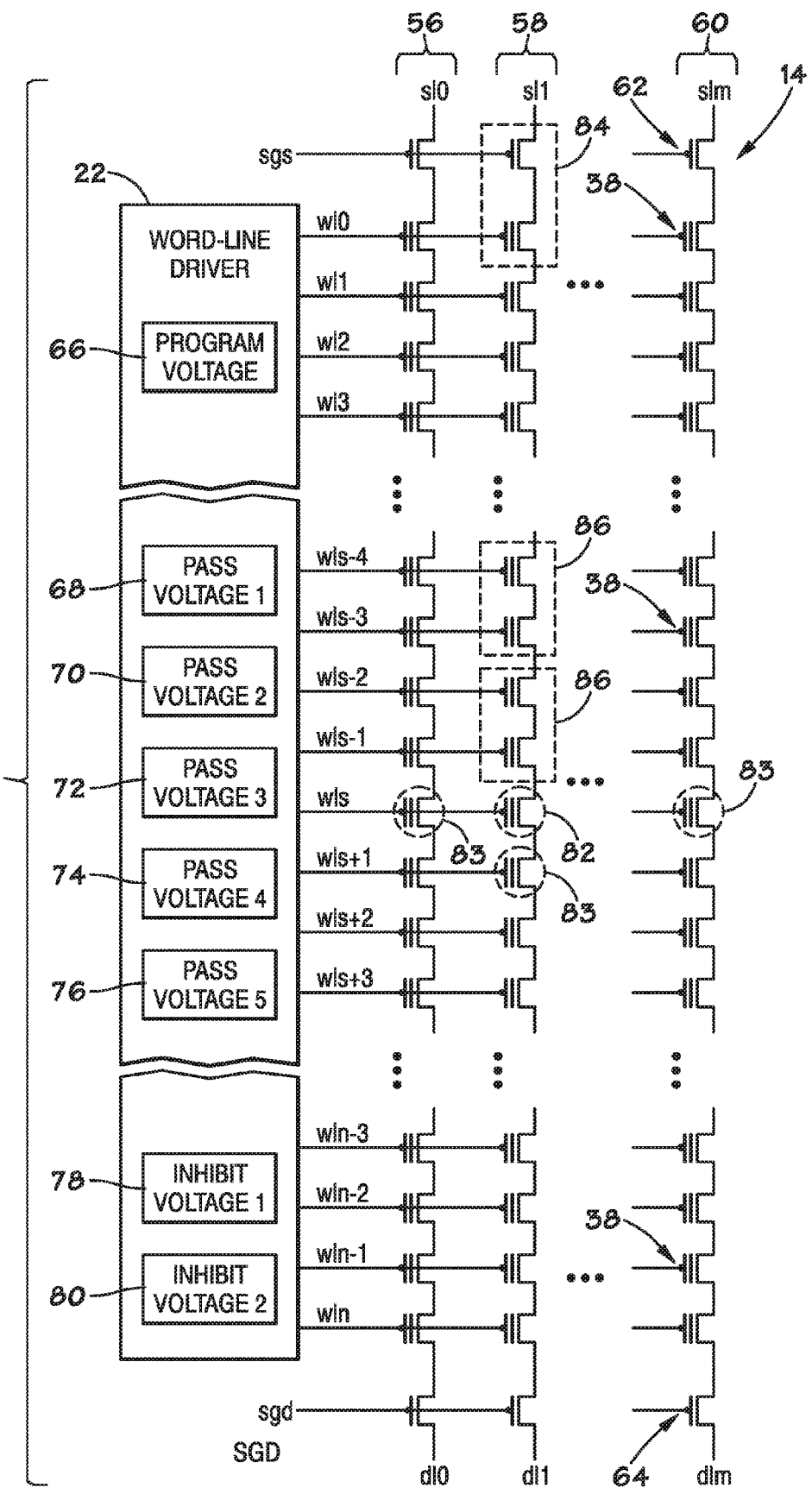
FIG. 5 illustrates a memory array that embodies an aspect of the present technique.

FIG. 5 illustrates an example of the row drivers 22 that may assert the above-mentioned pulse patterns and an example of the memory array 14 (FIG. 2) through which the pulse patterns may be asserted. In this embodiment, the rows are control lines, so the row driver 22 is illustrated as a control-line driver 22. This embodiment includes n+1 control lines wl0 through wln, among which are a selected control line wls and adjacent control lines wls−4 through wls−1 and wls+1 through wls+3 on either side of wls. The value of n depends on the embodiment, e.g., n may be equal to 3, 7, 15, 31, 63, or 127. The illustrated memory array 14 also includes m+1 data lines s10 through slm that each cross each of the control lines wl0 through wln. Each of the data lines cooperate with each of the control lines to define a string 56, 58, and 60.

Each illustrated string 56, 58, and 60 includes a source select transistor 62, n+1 memory cells 38, and a drain select transistor 64. In this embodiment, the select transistors 62 and 64 and memory cells 38 are connected to one another in series, with the source of each select transistor 62 and 64 or memory cell 38 connected to the drain of the adjacent transistor 62 and 64 or memory cells 38 in the string 56, 58, and 60. In the illustrated orientation, the sources of the transistors 62 and 64 and memory cells 38 are toward the top and the drains are toward the bottom (though embodiments are not limited to the illustrated orientation), so the drain of the source select transistor 62 connects to the source of the memory cells 38 on control line wl0. In this embodiment, the memory cells 38 are floating-gate transistors, with their control gates connected to the control lines wl0 through wln. A source-side select signal sgs may control the source select transistors 62, and a drain-side select signal sgd may control the drain select transistors 64.

In this embodiment, the control-line driver 22 includes a variety of voltage sources, including a program voltage source 66; pass voltage sources 68, 70, 72, and 74; and inhibit voltage sources 78 and 80. These voltage sources 66, 68, 70, 72, 74, 78, and 80 may be configured to assert different voltages on the various control lines wl0 through wln. The voltage sources 66, 68, 70, 72, 74, 78, and 80, in some embodiments, include a charge pump having a plurality of capacitors configured to be sequentially connected to one another in parallel and then in series, or vice versa, to increase or to decrease voltages.

A selected memory cell 82 may be programmed by asserting a programming voltage on the selected control line wls. As explained above in reference to FIG. 3, the programming voltage may drive a charge onto, or off of, the floating gate 42 of the selected memory cell 82, thereby storing data. The program voltage source 66 may assert the programming voltage.

As mentioned above, in some conventional devices, programming could cause program disturb in unselected memory cells 83. In these conventional devices, when programming the selected memory cell 82, the programming voltage is also asserted on the same control line wls as is connected to unselected memory cells 83, so these memory cells 83 could also be inadvertently programmed. To reduce this effect, the unselected strings, 56 and 60 in this example, are self-boosted, a technique that may include 1) pre-charging and isolating the unselected strings 56 and 60, and 2) asserting a pattern of pass voltages that capacitively couple to the unselected strings 56 and 60 and boost the voltage of the channel 54 of the unselected memory cells 86 during programming of the selected memory cell 82. Bringing the channel 54 of the unselected memory cells 83 to a voltage that is closer to the programming voltage reduces the voltage between the floating gates 42 of the unselected memory cells 83 and their channels 54, and this reduces the tendency of charges to move onto, or off of, the floating gate 42 in the unselected memory cells 83. Thus, self-boosting reduces program disturb.

In conventional devices, however, the memory array 14 may suffer from data corruption due to high electric fields asserted during self-boosting. For example, when programming the memory cell 82 in the string 58, conventional devices often assert a pass voltage on wl0 that is much higher than the voltage of the source-side selection signal sgs. This voltage difference is believed to assert a relatively strong electric field in the region 84, thereby potentially injecting electrons into the floating gate of the memory cell 38 on wl0 and, in some instances, the memory cell 38 on wl1. Similarly, some conventional pass voltage patterns assert relatively large electric fields in regions 86 and 88, thereby corrupting data stored on memory cells 38 connected to control line wls−4. Additionally, fields in the region 87 are believed to corrupt data stored by memory cells 38 connected to control line wls−1.

Figure 6:
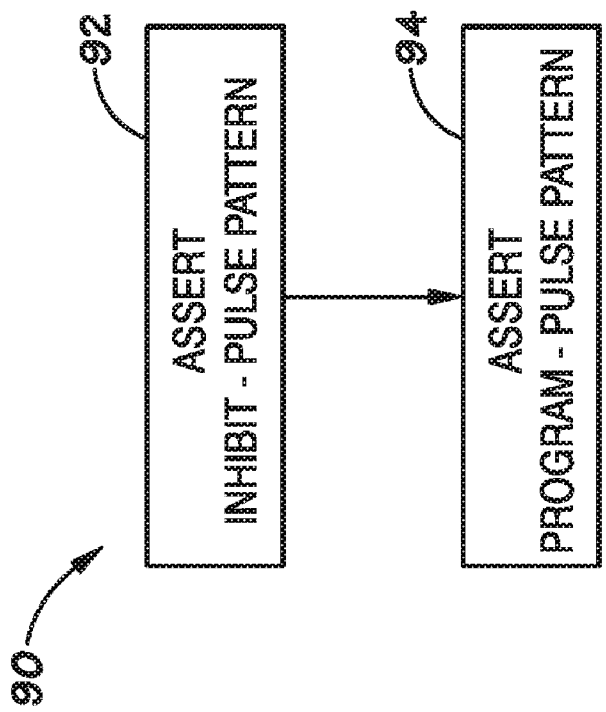
FIG. 6 illustrates a programming process that embodies the present technique.

Some or all of these issues may be mitigated by a programming process 90 illustrated by FIGS. 6 and 7. The programming operation begins with asserting an inhibit-pulse pattern, as illustrated by block 92 of FIG. 6. An example of an inhibit-pulse pattern is illustrated by the left column of FIG. 7. During the illustrated inhibit-pulse pattern, the control lines on the source side of the selected transistor wl0 through wls−1, the control line of the selected transistor wls, and the first control line on the drain side of the selected transistor wls+1 are generally at the same voltage of 4 volts. This group of control lines wl0 through wls+1 is referred to as the "source-side-inhibit group 89." In this example, the other control lines, wls+2 through wln are all at generally the same voltage of 2 volts. This group of control lines wls+2 through wln are referred to as the "drain-side-inhibit group 91." Thus, in this embodiment, the drain-side-inhibit group 91 has an inhibit-pulse voltage that is generally equal to half of the inhibit-pulse voltage of the source-side-inhibit group 89.

The inhibit-pulse pattern of FIG. 7 may be asserted by the control-line driver 22 of FIG. 5. The first inhibit voltage source 78 may assert 4 volts on the source-side-inhibit group 89, and the second inhibit voltage source 80 may assert 2 volts on the drain-side-inhibit group 91. The control-line driver 22 may assert these voltages concurrently or generally simultaneously.

During the presently described inhibit-pulse pattern, the data line of the selected memory cell and the data lines of the unselected memory cells are at different voltages, as illustrated by the bottom two rows of FIG. 7. In this example, the selected data line is generally grounded, and the unselected data lines are at approximately two volts, which is generally equal to the voltage asserted on the drain-side-inhibit group 91. Further, the drain-side select signal sgd is at approximately 4 volts, which is generally equal to the voltage of the source-side-inhibit group 89.

In operation, the inhibit-pulse pattern moves charges into the unselected data lines but not the selected data line. As illustrated by FIG. 7, the unselected data lines are at 2 volts, so current flows into the unselected data lines, but the selected data line remains generally grounded, at zero volts.

Because the source-side-inhibit group 89 is at a higher voltage than the drain-side-inhibit group 91, in some embodiments, the data lines may be pre-charged more evenly than in conventional designs. In some embodiments, the strings 56, 58, 60 (FIG. 5) are programmed sequentially from the source side, starting with wl0, to the drain side, ending with wln, so the memory cells 38 on the source side of the selected memory cell 82 may have a charge on their floating gates 42. Depending on the data stored, this charge may counteract the inhibit pulse and prevent the full data line from pre-charging. The larger voltage on the source-side-inhibit group 89, however, is believed to overcome the effect of data stored on source-side memory cells 38 and facilitate more uniform charge distribution along the data lines.

In other embodiments, one or more of the control lines may be in a different group 89 or 91. For instance, the source-side-inhibit group 89 may consist of the control lines wl0 through wls, wls−1, wls−2, or wls−3, and the remaining control lines may be in the drain-side-inhibit group 91. Further, other embodiments may include a source-side-inhibit group 89 or a drain-side-inhibit group 91 that includes control-lines at different voltages, e.g., incrementally increasing or decreasing within a group 89 or 91. In some embodiments, the voltage of the drain-side-inhibit group 91 may be generally less than, less than half of, or less than one quarter of, the voltage of the source-side-inhibit group 89.

After the inhibit-pulse pattern, the programming process 90 may assert a program-pulse pattern 94, as illustrated by block 94 of FIG. 6. An example of a program-pulse pattern is illustrated by the right column of the table of FIG. 7. During this step, pass voltages are asserted on various groups of control lines. Specifically, in this embodiment, 6 volts is asserted on an edge-program group 96; 8 volts is asserted on source-program group 98; an increasing range of voltages, from 0, to 4, to 10 volts, is asserted in an isolation-program group 100; and 10 volts is asserted on a drain-program group 102. Further, a program voltage of 24 volts is asserted on the selected control line wls. The source-side select signal sgs remains generally at ground, and the drain-side select signal sgd is lowered to 2 volts. Additionally, the selected data lines remain grounded, and the unselected data lines remain at 2 volts.

These voltages may be asserted by the control-line driver 22 (FIG. 5), and they may be asserted simultaneously or concurrently, e.g., the pass voltages may be asserted before the program voltage. Specifically, the first-pass-voltage source 68 may assert 6 volts on the edge-program group 96; the second-pass-voltage source 70 may assert 8 volts on the source-program group 98; the third-pass-voltage source 72 may assert 4 volts on wls-3 in the isolation-program group 100; and the fourth-pass-voltage source 74 may assert 10 volts on both wls-1 in the isolation-program group 100 and the drain-program group 102. The program-voltage source 66 may assert 24 volts on the selected control line wls.

Each of the different program groups 96, 98, 100, and 102 may either enhance the self-boosting effect, reduce undesirable side-effects from self-boosting, or both. For example, the edge-program group 96 may reduce electric fields in the region 84 (FIG. 5) relative to embodiments with a more abrupt voltage gradient between the conductors wl1, wl0, and sgs, and reducing the field strength is believed to reduce the likelihood of the program-pulse corrupting data stored by the memory cells in region 84. As noted above, if these fields are too large, various effects, such as hot electron and hot hole injection and gate-induced drain leakage, could corrupt data stored by the memory cells near region 84. By incrementally lowering the voltage of adjacent conductors wl1, wl0, and sgs, the fields between any two conductors are reduced.

Similarly, the voltage of the source-program group 98 is generally lower than the voltage of the drain-program group 102 to reduce electric fields both in region 84 and in region 86. The lower the voltage of the source-program group 98, the lower the voltage gradient between wl1, wl0, and sgs. The other side of the source-program group 98 is adjacent a grounded control line wls-3 in region 86, so the lower the voltage of the source-program group 98, the smaller the electric fields in region 86 between control lines wls-4 and wls-3.

The isolation-program group 100 is believed to enhance the self-boost effect under the selected control line wls. Self-boosting increases the inhibit potential of the channel 54 (FIG. 3) under the unselected floating gates 42. The inhibit potential, in some embodiments, is described by the following equation, in which $V_{BOOST}$ is the inhibit potential, $V_{INIT}$ is the initial voltage of the channel 54 after the inhibit pulse, $V_{DELTA-SEL}$ is the difference in voltage of the selected control line wls between the inhibit pulse and the program pulse, $V_{DELTA-UNSEL}$ is the difference in voltage of the unselected control lines between the inhibit pulse and the program pulse Cr is the capacitance between the cell channel and the control line divided by the total capacitance of the cell channel, and n is the number of memory cells connected to the source side of memory cell on the selected control line wls (Equation 1):

$$V_{BOOST} = V_{INIT} + (V_{DELTA-SEL} + n * V_{DELTA-UNSEL}) * \frac{Cr}{n}$$

As indicated by Equation 1, $V_{BOOST}$ can be increased by decreasing n. In the present embodiment, n is decreased by grounding the control line wls-3. Accordingly, instead of n equaling the total number of control lines on the source side of control line wls, n equals 2. The smaller value of n (all other things being equal) results in a larger $V_{BOOST}$, which decreases the likelihood of program disturb corrupting data stored by memory cells on unselected data lines.

In some embodiments, $V_{BOOST}$ may also be characterized with the following equation (Equation 2), in which k is an index variable for the control lines, s identifies the selected control line, $V_{(k, Program\_Pulse)}$ is the program pulse voltage for a given control line, and $V_{(k, Inhibit\_Pulse)}$ is the inhibit pulse voltage for a given control line:

$$V_{BOOST} = \frac{\sum_{k=s-2}^{k=n} V_{(k, Program\_Pulse)} - V_{(k, Inhibi\_Pulse)}}{(n+1)-(s-2)} * Cr$$

The illustrated isolation-program group 100 includes three control lines wls-1 through wls-3 to decrease electric fields in this region. The three control lines gradually ramp down the voltage from the program voltage of 24 volts on the selected control line wls to zero volts on the grounded control line wls-3. Other embodiments may have a larger or smaller isolation-program group 100 that ramps down the voltage over more or fewer control lines, and some embodiments may not ramp down the voltage over multiple control lines.

Equation 1 also explains the choice of the voltage of the drain-program group 102. Asserting a larger voltage through this group of control lines increases $V_{DELTA-UNSEL}$, the difference in unselected control line voltage between the inhibit pulse and the program pulse. Further, as noted above, the inhibit-pulse pattern asserts a lower voltage on the drain-inhibit group 91 than on the source-inhibit group 89. This also increases the effective $V_{DELTA-UNSEL}$ because the drain-inhibit group 91 shares many control lines with the drain-program group 102.

In short, the illustrated programming operation is believed to protect unselected memory cells from data corruption when writing to the selected memory cell. The inhibit-pulse pattern asserts a higher voltage on the source-inhibit group to adequately pre-charge the unselected data lines regardless of the data stored by their memory cells, and the program-pulse pattern enhances the self-boost effect under the selected control line without establishing data-corrupting electric fields near unselected memory cells.

Figure 8:
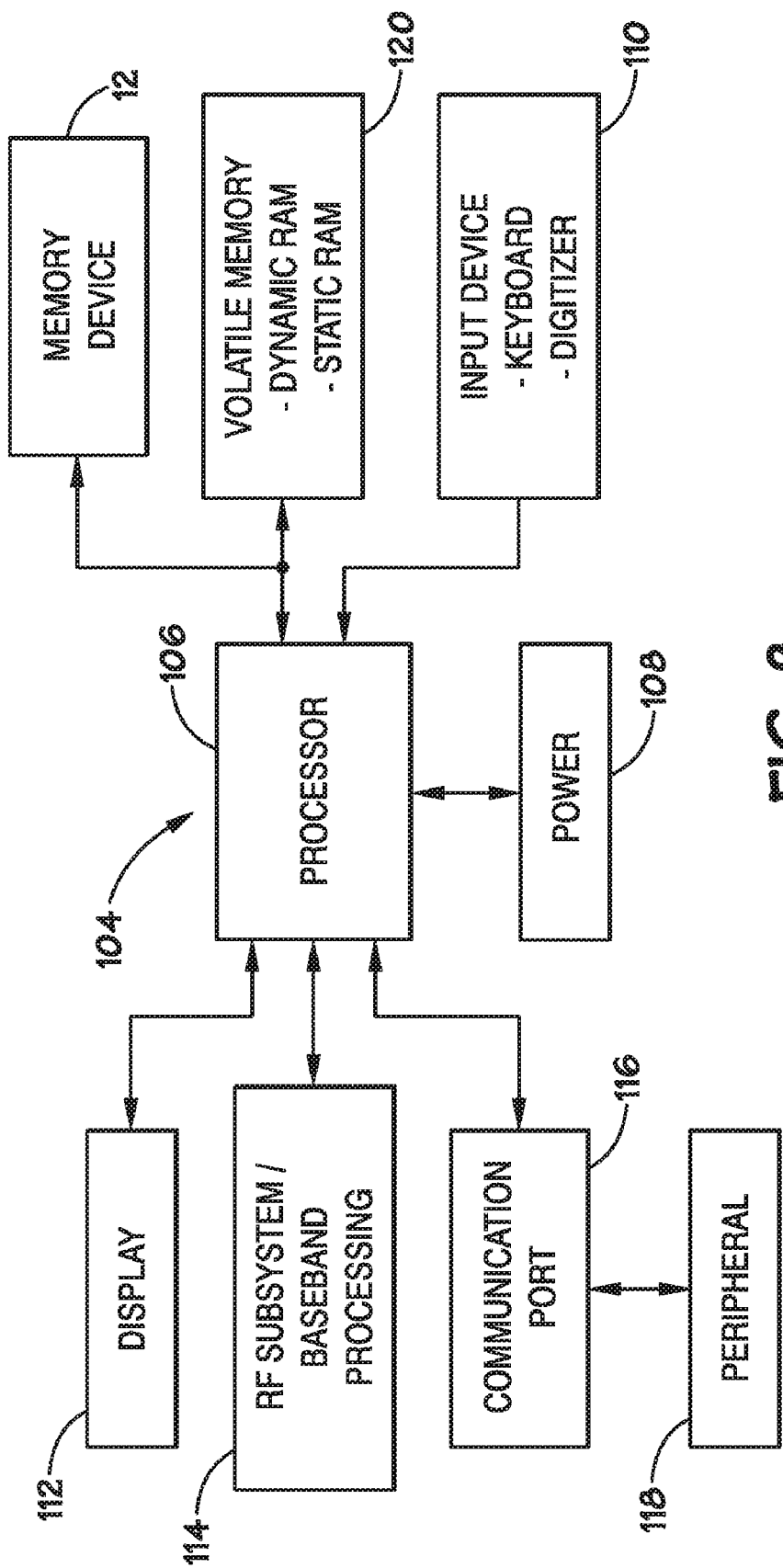
FIG. 8 illustrates an example of a system including the memory device of FIG. 2.

FIG. 8 depicts an example of a processor-based system 104 that includes the memory device 12 (FIG. 2). The system 104 may be any of a variety of types such as a computer, pager, cellular phone, personal organizer, control circuit, etc. In a typical processor-based system, one or more processors 106, such as a microprocessor, control the processing of system functions and requests in the system 104. The processor 106 and other subcomponents of the system 104 may include quantizing circuits, such as those discussed above.

The system 104 typically includes a power supply 108. For instance, if the system 104 is a portable system, the power supply 108 may advantageously include a fuel cell, permanent batteries, replaceable batteries, and/or rechargeable batteries. The power supply 108 may also include an AC adapter, so the system 104 may be plugged into a wall outlet, for instance. The power supply 108 may also include a DC adapter such that the system 104 may be plugged into a vehicle cigarette lighter, for instance.

Various other devices may be connected to the processor 106 depending on the functions that the system 104 performs. For instance, a user interface 110 may be connected to the processor 106. The user interface 110 may include buttons, switches, a keyboard, a light pen, a mouse, a digitizer and stylus, and/or a voice recognition system, for instance. A display 112 may also be connected to the processor 106. The display 112 may include an LCD, an SED display, a CRT display, a DLP display, a plasma display, an OLED display, LEDs, and/or an audio display, for example. Furthermore, an RF sub-system/baseband processor 114 may also be connected to the processor 106. The RF sub-system/baseband processor 114 may include an antenna that is connected to an RF receiver and to an RF transmitter (not shown). One or more communication ports 116 may also be connected to the processor 106. The communication port 116 may be adapted to be connected to one or more peripheral devices 118 such as a modem, a printer, a computer, or to a network, such as a local area network, remote area network, intranet, or the Internet, for instance.

The processor 106 generally controls the system 104 by implementing software programs stored in the memory. The memory is operably connected to the processor 106 to store and facilitate execution of various programs. For instance, the processor 106 may be connected to the volatile memory 120 which may include Dynamic Random Access Memory (DRAM) and/or Static Random Access Memory (SRAM). The volatile memory 120 is typically large so that it can store dynamically loaded applications and data. As described further below, the volatile memory 120 may be configured in accordance with embodiments of the present invention.

The processor 106 may also be connected to the memory device 12. The memory device 12 may include a read-only memory (ROM), such as an EPROM, and/or flash memory to be used in conjunction with the volatile memory 120. The size of the ROM is typically selected to be just large enough to store any necessary operating system, application programs, and fixed data. Additionally, the non-volatile memory 120 may include a high capacity memory such as a tape or disk drive memory.

The memory device 10 and volatile memory 120 may store various types of software, such as an operating system or office productivity suite including a word processing application, a spreadsheet application, an email application, and/or a database application. These programs may be stored on a variety of tangible machine readable mediums.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
    a memory array comprising floating-gate transistors, wherein respective pluralities of the floating-gate transistors have commonly-coupled control gates; and
    a driver configured to enable a selected one of the floating-gate transistors to be programmed, wherein the driver is configured to assert a first pulse pattern and a second pulse pattern on the control gates of the floating-gate transistors, wherein voltages of pulses of the first pulse pattern asserted on control gates of a first group of pluralities of the floating-gate transistors on a source side of the selected one of the floating gate transistors are higher than voltages of the first pulse pattern asserted on control gates of a second group of pluralities of the floating-gate transistors on a drain side of the selected one of the floating-gate transistors.

2. The device of claim 1, wherein the first pulse pattern is an inhibit pulse pattern.

3. The device of claim 1, wherein the second pulse pattern is a program pulse pattern.

4. The device of claim 1, wherein the voltages of the pulses of the first pulse pattern asserted on control gates of the first group of pluralities of the floating-gate transistors on the source side of the selected one of the floating gate transistors are at least 50 percent higher than the voltages of the first pulse pattern asserted on control gates of the second group of pluralities of the floating-gate transistors on the drain side of the selected one of the floating-gate transistors.

5. The device of claim 1, wherein the first group comprises substantially all of the pluralities of the floating-gate transistors on the source side of the selected control line.

6. The device of claim 1, wherein the first group comprises the one of the pluralities of the floating-gate transistors that includes the selected one of the floating-gate transistors and an adjacent one of the pluralities of the floating-gate transistors on the drain side of the selected one of the floating-gate transistors.

7. The device of claim 1, wherein the driver is configured to assert the second pulse pattern to the plurality of floating-gate transistors to program the selected one of the floating-gate transistors, wherein the second pulse pattern comprises pulses to a source-program group of the pluralities of the floating-gate transistors and pulses to a drain-program group of the pluralities of the floating-gate transistors, wherein the pulses to the source-program group are lower in voltage than the pulses to the drain-program group.

8. The device of claim 7, wherein the second pulse pattern comprises a pulse at a first voltage to the one of the pluralities of the floating-gate transistors that includes the selected one of the floating-gate transistors; pulses at a second voltage to an edge-program group; and pulses at a third voltage, fourth voltage, and fifth voltage to an isolation-program group.

9. The device of claim 8, wherein the first voltage is higher than the second voltage, the third voltage, the fourth voltage, and the fifth voltage.

10. The device of claim 7, wherein the second pulse pattern comprises pulses to an isolation group consisting of three of the pluralities of the floating-gate transistors.

11. A method of programming a selected memory cell, the method comprising:
    asserting a first pulse pattern comprising:
        a first inhibit voltage on a first side of the selected memory cell; and
        a second inhibit voltage on a second side of the selected memory cell; and
    after asserting the first pulse pattern, asserting a second pulse pattern comprising:
        a programming voltage on the selected memory cell;
        a first pass voltage on memory cells on the first side of the selected memory cell; and
        a second pass voltage on memory cells on the second side of the selected memory cell.

12. The method of claim 11, wherein the first inhibit voltage and the second inhibit voltage are asserted concurrently.

13. The method of claim 11, wherein the first pass voltage and the second pass voltage are asserted concurrently.

14. The method of claim 11, wherein the programming voltage, the first pass voltage, and the second pass voltage are asserted concurrently.

15. The method of claim 11, wherein an absolute value of the first inhibit voltage is greater than an absolute value of the second inhibit voltage.

16. The method of claim 11, wherein an absolute value of the second pass voltage is greater than an absolute value of the first pass voltage.

17. The method of claim 11, comprising asserting a third pass voltage on memory cells on the first side of the selected memory cell to which the first pass voltage is not asserted, wherein the third pass voltage is lower than the first pass voltage.

18. A memory device comprising:
   memory cells; and
   a driver configured to concurrently assert a first pulse pattern and a second pulse pattern on the memory cells, wherein the first pulse pattern comprises a first voltage on a plurality of memory cells on a first side of a selected one of the memory cells and a second voltage on a plurality of memory cells on a second side of the selected one of the memory cells, wherein the second pulse pattern comprises a third voltage on another plurality of memory cells on the first side of the selected one of the memory cells and a fourth voltage on another plurality of memory cells on the second side of the selected one of the memory cells, wherein the first voltage is higher than the second voltage and the third voltage is lower than the fourth voltage.

19. The memory device of claim 18, wherein the third voltage or the fourth voltage, or both the third voltage and the fourth voltage, are higher than the first voltage or the second voltage, or both the first voltage and the second voltage.

20. The memory device of claim 18, wherein the first pulse pattern is an inhibit pulse pattern and the second pulse pattern is a program pulse pattern.

21. The memory device of claim 18, wherein the first side of the selected one of the memory cells comprises a drain side of the selected one of the memory cells and the second side of the selected one of the memory cells comprises a source side of the selected one of the memory cells.

* * * * *